United States Patent
Masui et al.

[11] Patent Number: 5,906,687
[45] Date of Patent: May 25, 1999

[54] ULTRASONIC CLEANING APPARATUS AND METHOD

[75] Inventors: Kenji Masui, Kawasaki; Hidehiro Watanabe, Tokyo; Akio Kosaka, Kawasaki, all of Japan

[73] Assignee: Kabushiki Kaisha Toshiba, Kawasaki, Japan

[21] Appl. No.: 08/914,774

[22] Filed: Aug. 20, 1997

[30] Foreign Application Priority Data

Aug. 23, 1996 [JP] Japan ..................................... 8-222533
Aug. 15, 1997 [JP] Japan ..................................... 9-220486

[51] Int. Cl.⁶ ........................................................ B08B 7/00
[52] U.S. Cl. ................................ 134/1.3; 15/94; 15/97.1; 15/102; 134/1; 134/6; 422/20
[58] Field of Search ............................. 15/102, 97.1, 94; 134/1.3, 6, 1; 422/20

[56] References Cited

U.S. PATENT DOCUMENTS

| | | | |
|---|---|---|---|
| 3,635,762 | 1/1972 | Ott et al. ........................................ | 134/1 |
| 3,660,860 | 5/1972 | Dziuk .............................................. | 15/94 |
| 5,240,675 | 8/1993 | Wilk et al. ...................................... | 422/20 |
| 5,350,428 | 9/1994 | Leroux et al. ............................ | 29/25.01 |
| 5,551,986 | 9/1996 | Jain ................................................. | 134/6 |
| 5,636,401 | 6/1997 | Yonemizu et al. ............................. | 15/77 |

*Primary Examiner*—Krisanne Thornton
*Attorney, Agent, or Firm*—Finnegan, Henderson, Farabow, Garrett & Dunner, L.L.P.

[57] ABSTRACT

This specification discloses an invention directed to an ultrasonic cleaning apparatus for cleaning a cleaning target. The ultrasonic cleaning apparatus includes a liquid discharge nozzle having a discharge port to discharge a liquid therethrough, an ultrasonic vibrator for applying ultrasonic vibrations to the liquid which is to be supplied to the nozzle, and a cleaning member which is mounted on the discharge port of the nozzle, vibrates while holding therein the liquid discharged through the discharge port, and comes into contact with the cleaning target with a predetermined area, thereby scrub-cleaning the surface of the cleaning target.

12 Claims, 5 Drawing Sheets

ULTRASONIC CLEANING APPARATUS AND METHOD

BACKGROUND OF THE INVENTION

The present invention relates to a cleaning apparatus and method that utilize ultrasonic waves and, more particularly, to an ultrasonic cleaning method and apparatus suitable for removing contaminants attaching to the surface of a semiconductor substrate or the like and for drying the semiconductor substrate after the contaminants are removed.

Conventionally, as a method of mechanically removing substances attaching to the surface of an object to be cleaned, e.g., a semiconductor substrate or a reticle, scrub cleaning and ultrasonic cleaning are known.

According to scrub cleaning, a scrub member on which a nylon brush or the like is arranged is rotated. The surface of the cleaning target is cleaned by scrubbing, thereby removing substances attaching to the surface of the cleaning target. According to ultrasonic cleaning, the cleaning target is dipped in a cleaning liquid, which is vibrated within the ultrasonic band to apply vibrations to substances attaching to the surface of the cleaning target, thereby removing the substances.

In scrub cleaning, in order to prevent the scrub member and the cleaning target from coming into direct contact with each other, the cleaning liquid is constantly supplied to the surface of the cleaning target such that it exists between the scrub member and the cleaning target. Sometimes, however, the cleaning liquid does not sufficiently reach the interface between the cleaning target and scrub member, and the cleaning target substrate and the scrub member come into direct contact with each other.

In this case, the cleaning target may break, or the nylon brush or the like of the scrub member wears to generate dust, causing contamination. If a soft scrub member is used in order to prevent wear of the scrub member, the effect of removing the attaching substances may be decreased.

In ultrasonic cleaning, as described above, the substances attaching to the surface of the cleaning target are removed by applying vibrations to them. Hence, it is very difficult to remove film-like attaching substances.

With either cleaning method, recontamination by removed substances attaching to the cleaned target again must be prevented. For this purpose, the cleaning target must be cleaned again before drying. A simple apparatus for achieving this is sought for.

BRIEF SUMMARY OF THE INVENTION

The present invention has been made in order to solve the drawbacks of the conventional cleaning methods, and has as its practical object to provide an ultrasonic cleaning apparatus and method that can perform highly effective cleaning without fracturing the cleaning target and without causing recontamination.

It is another object of the present invention to provide an ultrasonic cleaning apparatus and method that can dry a cleaning target, which has been cleaned, while preventing recontamination.

In order to achieve the above objects, according to the first aspect of the present invention, there is provided an ultrasonic cleaning apparatus for cleaning a cleaning target, comprising: a nozzle having a discharge port to discharge a liquid therethrough; ultrasonic vibration applying means for applying ultrasonic vibrations to the liquid which is to be supplied to the nozzle; and a cleaning member which is mounted on the discharge port of the nozzle, vibrates while holding therein the liquid discharged through the discharge port, and comes into contact with the cleaning target with a predetermined area, thereby scrub-cleaning a surface of the cleaning target.

The liquid is preferably heated to a predetermined temperature.

With this arrangement, a scrub cleaning effect and an ultrasonic cleaning effect can be obtained simultaneously, thereby cleaning the cleaning target.

According to the second aspect of the present invention, in the ultrasonic cleaning apparatus according to the first aspect, the cleaning member has small pores at least in a contact portion with the cleaning target to pass the liquid held in the cleaning member to an outside, and during cleaning, the liquid which has passed through the pores is caused to be present at the contact portion of the cleaning member and cleaning target.

With this arrangement, the liquid is always present between the cleaning member and the cleaning target. Therefore, the cleaning target or cleaning member can be prevented from being fractured by friction.

According to the third aspect of the present invention, the ultrasonic cleaning apparatus according to the first aspect further has a cleaning tank filled with the liquid, and cleaning target holding means for allowing cleaning while positioning a contact portion of the cleaning member and cleaning target in the liquid filled in the cleaning tank. In this case, the apparatus preferably has a heater for heating the liquid in the cleaning tank to a predetermined temperature. The apparatus also preferably has driving means for driving the cleaning target and cleaning member relative to each other in the cleaning tank.

With this arrangement, contaminants separated from the cleaning target diffuse into the liquid filled in the cleaning tank. Therefore, the contaminants are prevented from reattaching to the cleaning target.

According to the fourth aspect of the present invention, there is provided an ultrasonic cleaning method of cleaning a cleaning target, comprising filling a cleaning member with a liquid applied with ultrasonic vibrations, driving the cleaning member with vibrations of the liquid, and causing the cleaning member to come into contact with the cleaning target with a predetermined area, thereby scrub-cleaning a surface of the cleaning target.

According to the fifth aspect of the present invention, in the ultrasonic cleaning method according to the fourth aspect, the cleaning member is formed with small pores at least in a contact portion with the cleaning target to pass the liquid held in the cleaning member to an outside, and cleaning is performed while causing the liquid which has passed through the pores to be present at the contact portion of the cleaning member and cleaning target.

According to the sixth aspect of the present invention, in the ultrasonic cleaning method according to the fourth aspect, the liquid is heated to a predetermined temperature, and after cleaning, a surface of the cleaning target is dried.

According to the sixth aspect, after the cleaning target is cleaned, it can be dried successively. Therefore, the cleaning target can be prevented from being recontaminated before drying.

According to the seventh aspect of the present invention, in the ultrasonic cleaning method according to the fourth aspect, cleaning is performed while a contact portion of the cleaning member and cleaning target is positioned in the liquid filled in the cleaning tank. In this case, the liquid in the cleaning tank is preferably heated to a predetermined temperature.

According to the eighth aspect of the present invention, in the ultrasonic cleaning method according to the seventh aspect, after cleaning in the liquid filled in the cleaning tank is complete, the liquid in the cleaning tank is quickly discharged, and the cleaning target is pulled up relatively while being kept in contact with the cleaning member, thereby drying the cleaning target.

With this arrangement, not only cleaning but also drying after cleaning can be performed effectively.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

The embodiments of the present invention will be described with reference to the accompanying drawings.
(First Embodiment)

Figure 1:
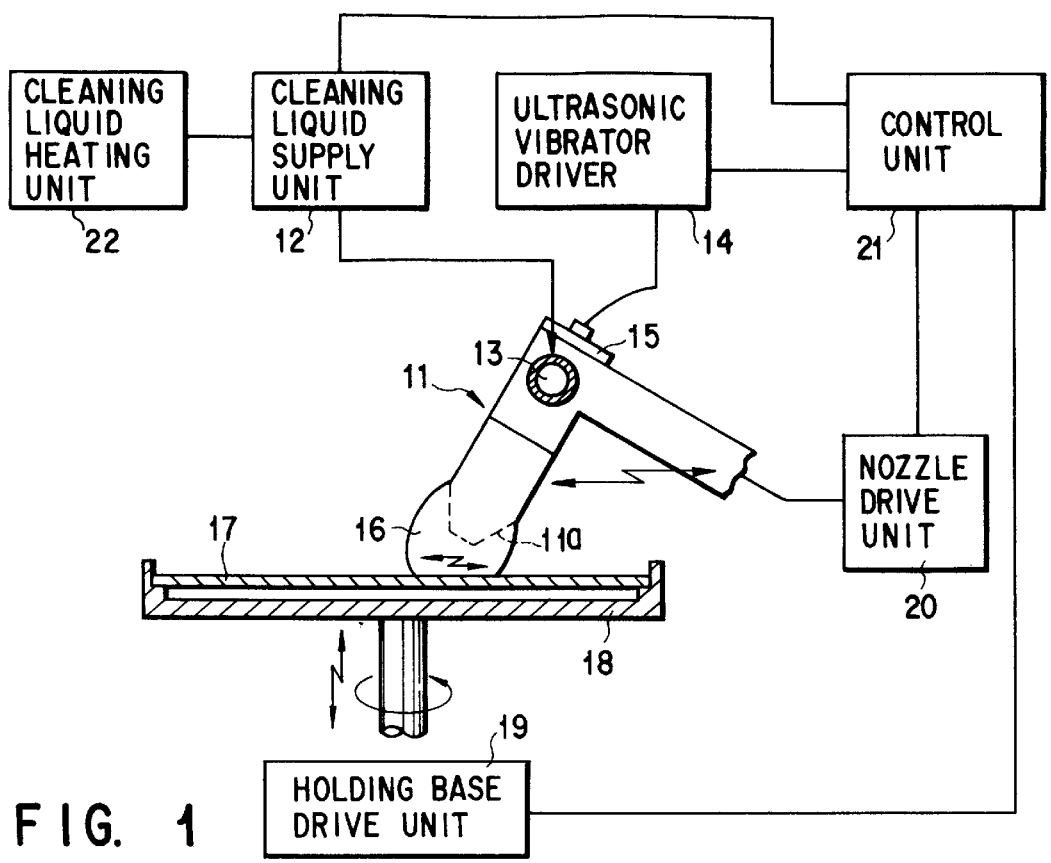
FIG. 1 is a partially sectional schematic front view showing the first embodiment of the present invention.

FIG. 1 shows the first embodiment of the present invention.

Referring to FIG. 1, reference numeral 11 denotes a liquid discharge nozzle for discharging a cleaning liquid. The liquid discharge nozzle 11 is connected to a cleaning liquid supply unit 12 through a connection pipe 13 and discharges the cleaning liquid supplied from the cleaning liquid supply unit 12 through its distal end portion 11a.

An ultrasonic vibrator 15 connected to a driver 14 is mounted on the liquid discharge nozzle 11. The ultrasonic vibrator 15 applies ultrasonic vibrations to the liquid discharged from the liquid discharge nozzle 11.

The distal end portion 11a of the liquid discharge nozzle 11 is capped with a bag-like cleaning member 16. The cleaning liquid discharged from the liquid discharge nozzle 11 is held in the cleaning member 16. The cleaning member 16 is vibrated at a predetermined frequency by the ultrasonic vibrations applied by the cleaning liquid.

The cleaning member 16 is made of a thin flexible material and is formed with a large number of pores for passing the cleaning liquid filled in the cleaning member 16 to the outside. An example of the material preferable for constituting the cleaning member 16 includes PVA (polyvinyl alcohol), but can be other materials.

Reference numeral 17 in FIG. 1 denotes a semiconductor substrate serving as a cleaning target. The semiconductor substrate 17 is held by a holding base 18, and is driven to rotate by actuation of a holding base drive unit 19 comprising a vertical cylinder, a motor, and the like.

The liquid discharge nozzle 11 is connected to a nozzle drive unit 20, and is driven by it in the radial direction of the holding base 18.

The cleaning liquid supply unit 12, the ultrasonic vibrator driver 14, the holding base drive unit 19, and the nozzle drive unit 20 are connected to a control unit 21, and are controlled to operate synchronously.

The operation of the ultrasonic cleaning apparatus will be described.

First, the cleaning liquid supply unit 12 is actuated to discharge the cleaning liquid from the distal end of the liquid discharge nozzle 11 into the cleaning member 16, thereby filling the cleaning member 16 with the cleaning liquid. At the same time, the ultrasonic vibrator 15 is actuated to apply ultrasonic vibrations to the cleaning liquid, thereby vibrating the cleaning member 16.

The holding base 18 is driven upward to bring the surface of the semiconductor substrate 17 into contact with the cleaning member 16 with a predetermined area. As a result, the surface of the semiconductor substrate 17 is scrub-cleaned by the vibrating cleaning member 16. The cleaning liquid filled in the cleaning member 16 is present at the contact portion with the semiconductor substrate 17 through the large number of pores formed in the cleaning member 16.

The semiconductor substrate 17 is rotated and the liquid discharge nozzle 11 is driven in the radial direction to clean substantially the entire surface of the semiconductor substrate 17.

In this embodiment, a cleaning liquid heating unit 22 is connected to the cleaning liquid supply unit 12 to heat the cleaning liquid which is to be supplied to the cleaning member 16 to a predetermined temperature.

With this arrangement, the semiconductor substrate 17 can be cleaned effectively due to the scrub cleaning effect obtained by the vibrating cleaning member 16 and the ultrasonic cleaning effect obtained by the cleaning liquid discharged from the surface of the cleaning member 16.

More specifically, substances firmly attaching to the semiconductor substrate 17 or film-like substances attaching to the semiconductor substrate 17 are separated from the semiconductor substrate 17 or broken into small pieces by friction with the vibrating cleaning member 16. The comparatively small pieces attaching to the semiconductor substrate 17 are removed through ultrasonic cleaning done by the ultrasonic-vibrating cleaning liquid which has passed through the cleaning member 16. When the cleaning liquid is heated to a predetermined temperature, the cleaning effect is further improved.

The cleaning liquid is always prevent between the cleaning member 16 and the semiconductor substrate 17 to serve as a lubricant. This prevents wear of the cleaning member 16, which causes recontamination and damage to the surface of the semiconductor substrate 17.
(Second Embodiment)

The second embodiment of the present invention will be described with reference to FIGS. 2 and 3.

The constituent elements identical to those in the first embodiment described above are denoted by the same reference numerals or are omitted, and a detailed description thereof will be omitted.

Figure 2:
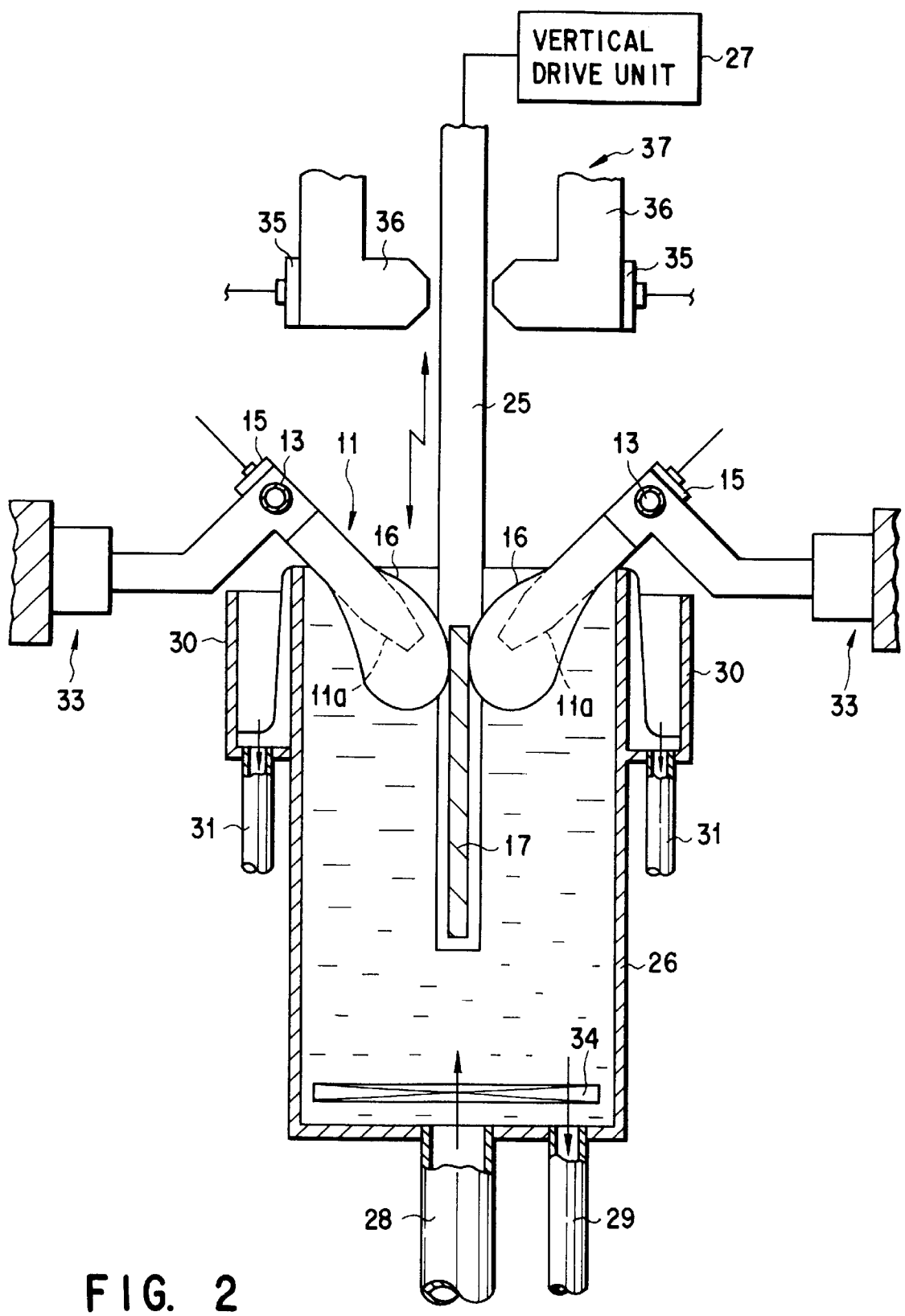
FIG. 2 is a partially sectional schematic front view showing the second embodiment of the present invention.
Figure 3:
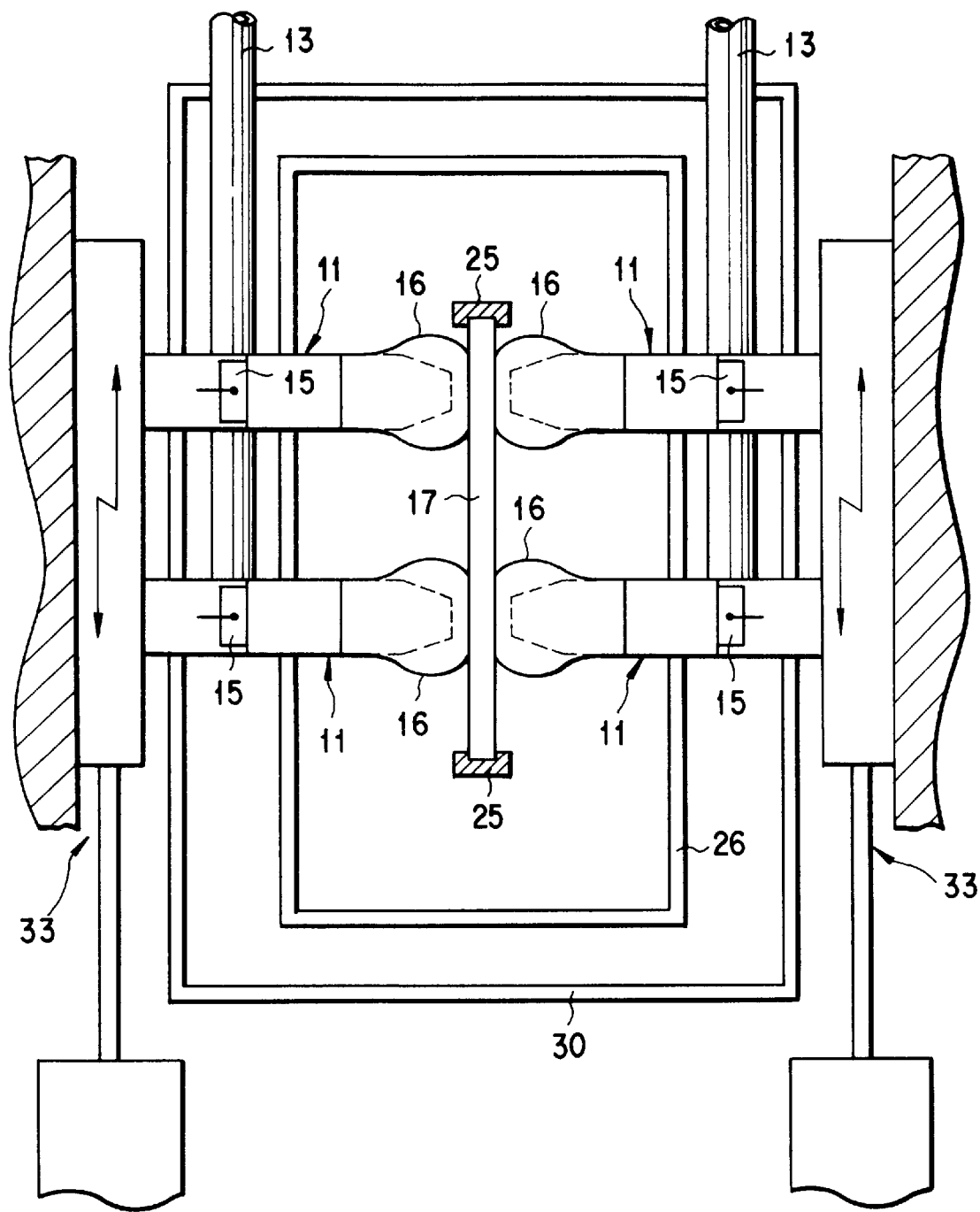
FIG. 3 is a plan view showing the second embodiment of the present invention.

FIG. 2 shows the longitudinally sectional front view of the second embodiment, and FIG. 3 is a plan view of the same.

In this embodiment, a semiconductor substrate 17 is held by substrate holding arms 25 to stand vertically, and is dipped in a cleaning tank 26 filled with a cleaning liquid. The substrate holding arms 25 are connected to a vertical drive unit 27 so that they can load/unload the semiconductor substrate 17 into/from the cleaning tank 26 in the vertical direction.

The cleaning tank 26 is connected to a liquid supply pipe 28 and a liquid discharge pipe 29. The contaminated cleaning liquid is discharged from the cleaning tank 26 through the liquid discharge pipe 29, and fresh cleaning liquid is constantly supplied to the cleaning tank 26 through the liquid supply pipe 28. As a consequence, the cleaning liquid filled in the cleaning tank 26 is always maintained clean.

An outer tank 30 for accepting the cleaning liquid overflowing from the cleaning tank 26 is arranged around the outer circumferential wall of the cleaning tank 26. The cleaning liquid overflowing into the outer tank 30 is discharged through a liquid discharge pipe 31 for the outer tank 30.

In this embodiment, a heater 34 is arranged near the bottom portion of the cleaning tank 26 to increase the temperature of the cleaning liquid filled in the cleaning tank 26, thereby improving the cleaning effect.

In this embodiment, a plurality of liquid discharge nozzles 11 and a plurality of cleaning members 16 are disposed so that one and the other surfaces of the semiconductor substrate 17 can be cleaned simultaneously. More specifically, as shown in FIG. 3, two liquid discharge nozzles 11 and two cleaning members 16 are provided to oppose one surface of the semiconductor substrate 17, and another two liquid discharge nozzles 11 and another two cleaning members 16 are provided to oppose the other surface of the semiconductor substrate 17, resulting in a total of four liquid discharge nozzles 11 and a total of four cleaning members 16.

The liquid discharge nozzles 11 are held by drive cylinder units 33 arranged on the two sides of the cleaning tank 26 to sandwich it, and are reciprocally driven in a direction parallel to the one and the other surfaces of the semiconductor substrate 17.

In cleaning, the drive cylinder units 33 are actuated, and simultaneously the holding arms 25 that hold the semiconductor substrate 17 are vertically moved, so that substantially the entire portions of one and the other surfaces of the semiconductor substrate 17 can be cleaned.

When cleaning is ended, the holding arms 25 are driven upward to pull up the semiconductor substrate 17 from the cleaning tank 26. At this time, substances that have been separated from the semiconductor substrate 17 and drifting near the surface of the cleaning tank 26 sometimes attach to the semiconductor substrate 17 again.

For this reason, in this embodiment, a recleaning/drying unit 37 shown in FIG. 2 is provided above the cleaning tank 26. The recleaning/drying unit 37 has recleaning/dry nozzles 36. When moving the semiconductor substrate 17 upward, the recleaning/dry nozzles 36 spray hot water, to which ultrasonic waves are applied by ultrasonic vibrators 35, to the surfaces of the semiconductor substrate 17, thereby cleaning the semiconductor substrate 17 again.

Since hot water heated to a predetermined temperature is sprayed, drying of the semiconductor substrate 17 after recleaning is promoted.

With the above arrangement, in addition to the effect of the first embodiment, the following effect can be obtained.

More specifically, in this embodiment, cleaning is performed in the cleaning tank 26. Since the cleaning liquid in the cleaning tank 26 is always circulated and maintained clean, as described above, substances that have been separated from the semiconductor substrate 17 are prevented as much as possible from attaching to the semiconductor substrate 17 again.

Since the cleaning members 16 and the surface of the semiconductor substrate 17 always come into contact with each other in a wet state, the service life of the cleaning members 16 can be prolonged when compared to the first embodiment.

Since the cleaning liquid is heated by the heater 34 arranged in the cleaning tank 26, substances attaching to the semiconductor substrate 17 can be easily removed, thereby improving the cleaning effect.

In this embodiment, the recleaning/drying unit 37 is employed to spray hot water applied with the ultrasonic wave to the semiconductor substrate 17, thereby recleaning and drying the semiconductor substrate. However, if recleaning and drying are performed in accordance with a method to be described hereinafter, the recleaning/drying unit 37 becomes unnecessary.

In this method, when cleaning of the semiconductor substrate 17 in the cleaning tank 26 is to be ended, the height of the substrate holding arms 25 is adjusted such that the cleaning members 16 comes into contact with the uppermost portion of the semiconductor substrate 17, as shown in FIG. 2.

The cleaning liquid in the cleaning tank 26 is quickly discharged through the liquid discharge pipe 29 to lower the liquid level of the cleaning tank 26. When the liquid level is quickly lowered in this manner, the separated substances drifting in the cleaning liquid can be prevented from attaching to the surface of the semiconductor substrate again.

The liquid discharge nozzles 11 are actuated, and simultaneously the holding arms 25 are driven upward, in order to pull up the semiconductor substrate 17 while cleaning the surfaces of the semiconductor substrate 17 with the vibrations of the cleaning members 16.

The surfaces of the semiconductor substrate 17 are cleaned again in this manner. When the liquid filled in the cleaning members 16 is heated to an appropriate temperature, drying after recleaning can be promoted.

If this drying method is employed, the following effect can be obtained.

More specifically, with the recleaning/drying unit 37 shown in FIG. 2, if the output of the ultrasonic vibrators 35 arranged to the recleaning/dry nozzles 36 is set to be almost equal to the output from the ultrasonic vibrators 15 arranged on the liquid discharge nozzles 11, the discharged hot water splashes much to cause recontamination. Therefore, the output of the ultrasonic vibrators 35 must be decreased.

With the arrangement described later, splashing of water by the cleaning members 16 can be suppressed effectively, and the output of the ultrasonic vibrators 35 need not be lowered. Since an extra recleaning/drying unit 37 is not required, the arrangement can be simplified.

(Third Embodiment)

Figure 4:
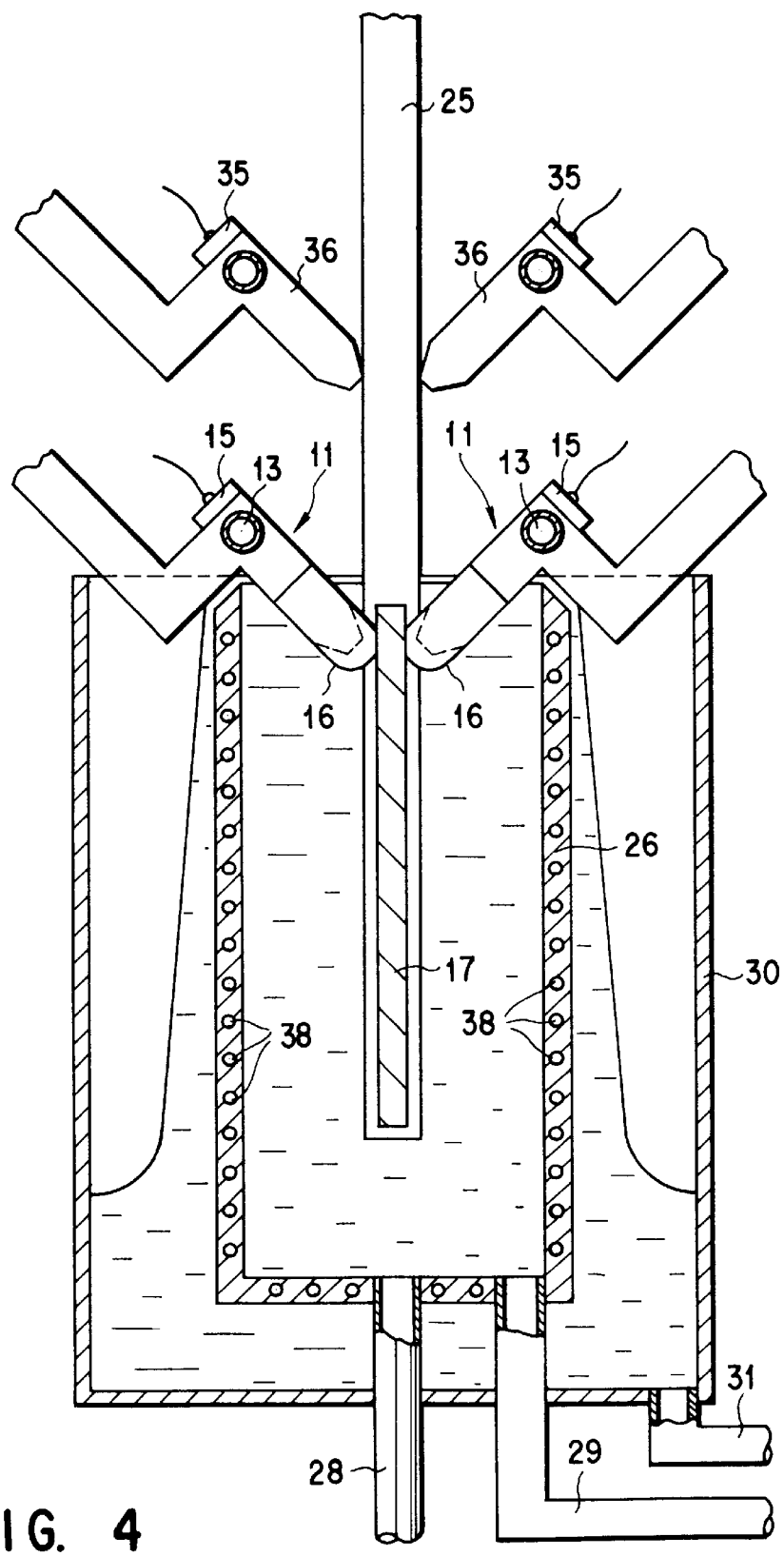
FIG. 4 is a partially sectional schematic front view showing the third embodiment of the present invention.

The third embodiment of the present invention will be described with reference to FIG. 4.

The constituent elements identical to those in the first and second embodiments are denoted by the same reference numerals, and a detailed description thereof will be omitted.

In this embodiment, a heater 38 is buried in the side and bottom walls of a cleaning tank 26.

With this arrangement, the same effect as that of the second embodiment can be obtained. Different from the second embodiment, the cleaning liquid can be heated from the side surfaces of the cleaning tank 26 as well. Therefore, the temperature of the cleaning liquid can be increased within a short period of time, and the temperature distribution of the cleaning liquid can be uniformed.

As a result, any substances attaching to a semiconductor substrate 17 can be removed more easily, and the cleaning effect can be improved even if the ultrasonic output is decreased.

(Fourth Embodiment)

Figure 5:
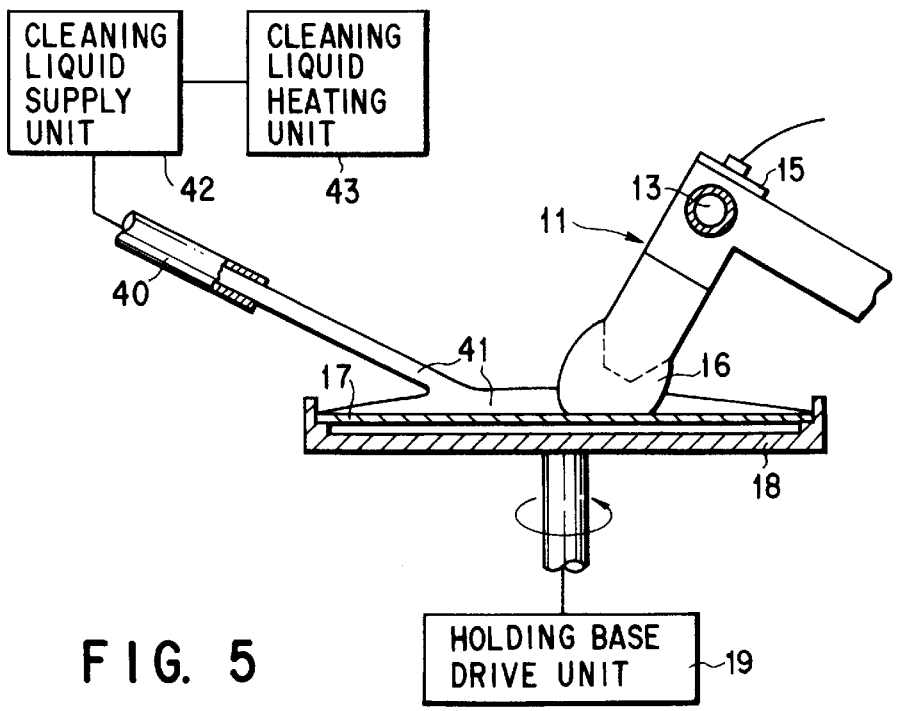
FIG. 5 is a partially sectional schematic front view showing the fourth embodiment of the present invention.

The fourth embodiment of the present invention will be described with reference to FIG. 5.

The constituent elements identical to those in the first to third embodiments described above are denoted by the same reference numerals or will be omitted, and a repetitive description thereof will be omitted.

An ultrasonic cleaning apparatus of this embodiment concerns a modification of the first embodiment described with reference to FIG. 1.

The ultrasonic cleaning apparatus of this embodiment has, in addition to a liquid discharge nozzle 11 and a cleaning member 16, a cleaning liquid supply nozzle 40 for supplying a cleaning liquid to a semiconductor substrate 17 held on a holding base 18.

When the holding base 18, the liquid discharge nozzle 11, and the cleaning member 16 are driven to clean the semiconductor substrate 17, the cleaning liquid supply nozzle 40 supplies a cleaning liquid 41 to the surface of the semiconductor substrate 17 such that the contact portion of the semiconductor substrate 17 and cleaning member 16 is covered with the cleaning liquid 41. At this time, the rotation speed of the holding base 18 is adjusted to such a value that the supplied cleaning liquid 41 will not be scattered by the centrifugal force. In this embodiment, this rotation speed is adjusted to about 100 rpm.

The cleaning liquid 41 is supplied after it is heated to a predetermined temperature by a cleaning liquid heating unit 43 connected to a cleaning liquid supply unit 42.

With this arrangement, the same arrangement as that of the first embodiment can be obtained. Also, since the contact portion of the cleaning member 16 and semiconductor substrate 17 is covered with the cleaning liquid, the same effect as that of the second embodiment can be obtained.

As the cleaning liquid 41 supplied through the cleaning liquid supply nozzle 40, for example, a nucleophilic reagent, e.g., ammonia water, can be used. In this case, in addition to the cleaning effect due to ultrasonic waves and scrubbing, another cleaning effect due to chemical reaction can be obtained. Therefore, the cleaning capability can be further improved.

(Fifth Embodiment)

Figure 6:
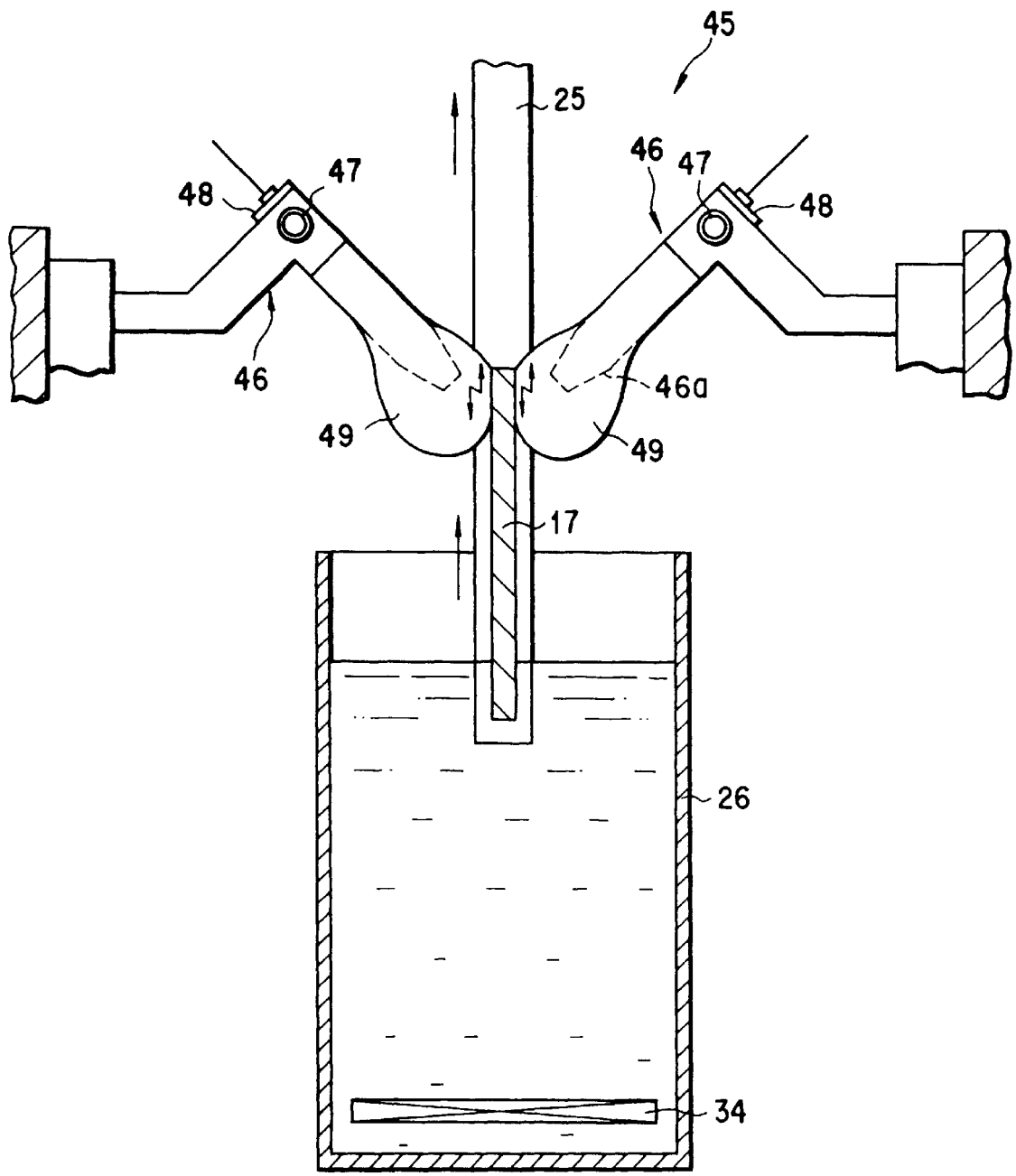
FIG. 6 is a partially sectional schematic front view showing the fifth embodiment of the present invention.

The fifth embodiment of the present invention will be described with reference to FIG. 6.

The fifth embodiment relates to a recleaning/drying unit 45 which can be used in place of the recleaning/drying unit indicated by reference numeral 37 in the ultrasonic cleaning apparatus shown in FIG. 2. Accordingly, in FIG. 6, of the arrangement of the ultrasonic cleaning apparatus shown in FIG. 2, those other than the recleaning/drying unit 45 are omitted.

The recleaning/drying unit 45 is constituted by liquid supply pipes 47, ultrasonic vibrators 48, and cleaning members 49. The liquid supply pipes 47 supply, e.g., hot pure water, to liquid discharge nozzles 46. The ultrasonic vibrators 48 are arranged on the liquid discharge nozzles 46 to apply ultrasonic waves to the hot pure water. The cleaning members 49 are placed on the distal ends of the liquid discharge nozzles 46. Each liquid discharge nozzle 46, each cleaning member 49, and other control units (not shown) can be identical to the liquid discharge nozzle 11, the cleaning member 16, and other control units shown in FIG. 1.

When drying a semiconductor substrate 17 which has been cleaned, the semiconductor substrate 17 is driven upward by holding arms 25 while it is in contact with the cleaning members 49, which vibrate one and the other surfaces of the semiconductor substrate 17, with a predetermined area. Hence, the semiconductor substrate 17 is pulled upward while it is cleaned again by the scrub cleaning effect and the ultrasonic cleaning effect. Since the heated pure water is discharged onto the semiconductor substrate 17, the semiconductor substrate 17 is heated to promote drying.

Since the cleaning members 49 hold the hot pure water applied with ultrasonic vibrations and are in contact with the semiconductor substrate 17, splashing of the hot pure water can be suppressed. Consequently, recontamination of the semiconductor substrate 17 by splashing can be effectively prevented.

In this embodiment, even if a volatile organic substance is used in place of hot pure water, the same effect can be obtained.

Before recleaning and drying, if the semiconductor substrate 17 is held in a cleaning tank 26 in which a heater 34 is disposed, the time required for drying the semiconductor substrate 17 can be shortened as the semiconductor substrate 17 is preheated.

In this embodiment, the recleaning/drying unit 45 is used together with the ultrasonic cleaning apparatus described above. However, the recleaning/drying unit 45 alone can be used as the drying unit.

In the first to fifth embodiments described above, a semiconductor substrate exemplifies a cleaning target. However, the present invention can naturally be used for cleaning other types of cleaning targets for example, a reticle.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. An ultrasonic cleaning apparatus for cleaning a cleaning target, comprising:

a nozzle having a discharge port to discharge a liquid therethrough;

ultrasonic wave applying means for applying ultrasonic vibrations to said liquid which is to be supplied to said nozzle; and a cleaning member which is mounted on said discharge port of said nozzle, vibrates while holding therein said liquid discharged through said discharge port, and comes into contact with the cleaning target with a predetermined area, thereby scrub-cleaning a surface of the cleaning target.

2. An apparatus according to claim 1, wherein said cleaning member has small pores at least in a contact portion with the cleaning target to pass said liquid held in said cleaning member to an outside, and during cleaning, said liquid which has passed through the pores is caused to be present at said contact portion of said cleaning member and cleaning target.

3. An apparatus according to claim 1, further having heating means for heating said liquid to a predetermined temperature.

4. An apparatus according to claim 1, further having a cleaning tank filled with said liquid, and cleaning target holding means for allowing cleaning while positioning a contact portion of said cleaning member and the cleaning target in said liquid filled in said cleaning tank.

5. An apparatus according to claim 4, further having a heater for heating said liquid in said cleaning tank to a predetermined temperature.

6. An apparatus according to claim 4, further having driving means for driving the cleaning target and said cleaning member relative to each other in said cleaning tank.

7. An ultrasonic cleaning method of cleaning a cleaning target, comprising:

filling a cleaning member with a liquid applied with ultrasonic vibrations, and driving said cleaning member with vibration of said liquid, and causing said cleaning member to come into contact with the cleaning target with a predetermined area, thereby scrub-cleaning a surface of the cleaning target.

8. A method according to claim 7, wherein said cleaning member is formed with small pores at least in a contact portion with the cleaning target to pass said liquid held in said cleaning member to an outside, and cleaning is performed while causing said liquid which has passed through the pores to be present at said contact portion of said cleaning member and the cleaning target.

9. A method according to claim 7, wherein said liquid is heated to a predetermined temperature, and after cleaning, a surface of the cleaning target is dried.

10. A method according to claim 7, wherein cleaning is performed while a contact portion of said cleaning member and the cleaning target is positioned in said liquid filled in said cleaning tank.

11. A method according to claim 10, wherein said liquid in said cleaning tank is heated to a predetermined temperature.

12. A method according to claim 10, wherein after cleaning in said liquid filled in said cleaning tank is complete, said liquid in said cleaning tank is quickly discharged, and the cleaning target is pulled up relatively while being in contact with said cleaning member, thereby drying the cleaning target.

* * * * *